United States Patent
Lee

(10) Patent No.: US 7,652,345 B2
(45) Date of Patent: Jan. 26, 2010

(54) ISOLATION LAYERS FOR SEMICONDUCTOR DEVICES INCLUDING FIRST AND SECOND SUB-TRENCHES AND METHODS OF FORMING THE SAME

(75) Inventor: Yun-Sung Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 225 days.

(21) Appl. No.: 11/453,423

(22) Filed: Jun. 15, 2006

(65) Prior Publication Data
US 2006/0292820 A1    Dec. 28, 2006

(30) Foreign Application Priority Data
Jun. 23, 2005    (KR) ................ 10-2005-0054227

(51) Int. Cl.
*H01L 21/20*    (2006.01)
(52) U.S. Cl. ............... 257/510; 438/435; 257/E29.02; 257/E21.546
(58) Field of Classification Search ........ 438/424, 438/218, 221, 248, 294, 296, FOR. 221, 435, 438/437, 762, 770, FOR. 223, FOR. 227; 257/501, 506, E29.018, E29.02, E21.54, 257/E21.545, 510, E21.546
See application file for complete search history.

(56) References Cited

U.S. PATENT DOCUMENTS

| | | | | |
|---|---|---|---|---|
| 4,385,947 A | * | 5/1983 | Halfacre et al. | 438/217 |
| 5,578,518 A | * | 11/1996 | Koike et al. | 438/424 |
| 5,719,085 A | * | 2/1998 | Moon et al. | 438/424 |
| 6,204,104 B1 | * | 3/2001 | Fujii | 438/234 |
| 6,423,618 B1 | * | 7/2002 | Lin et al. | 438/589 |
| 6,486,517 B2 | * | 11/2002 | Park | 257/374 |
| 2002/0070420 A1 | * | 6/2002 | Oh et al. | 257/506 |

FOREIGN PATENT DOCUMENTS

| | | |
|---|---|---|
| JP | 2003-309190 | 10/2003 |
| KR | 1020010055525 A | 7/2001 |
| KR | 2004-6041 | 1/2004 |

* cited by examiner

*Primary Examiner*—Matthew Smith
*Assistant Examiner*—Quovaunda Jefferson
(74) *Attorney, Agent, or Firm*—Myers Bigel Sibley & Sajovec

(57) ABSTRACT

In a device isolation layer for a p-MOS transistor and a method of forming the same, a trench oxide layer having a first and a second sub-oxide layers is formed in a trench including a first and a second sub-trenches. The first and second sub-oxide layers are formed on side and bottom surfaces of the first and second sub-trenches, respectively. The second sub-trench has a width greater than the first sub-trench. The first sub-oxide layer has a first thickness that is uniform along the side and bottom surfaces of the first sub-trench and the second sub-oxide layer has a second thickness greater than the first thickness along the side surface of the second sub-trench. A liner layer is formed on the trench oxide layer, and an insulation pattern is formed on the liner layer.

21 Claims, 8 Drawing Sheets

ISOLATION LAYERS FOR SEMICONDUCTOR DEVICES INCLUDING FIRST AND SECOND SUB-TRENCHES AND METHODS OF FORMING THE SAME

CROSS-REFERENCE TO RELATED APPLICATIONS

This application claims priority under 35 USC § 119 to Korean Patent Application No. 2005-54227 filed on Jun. 23, 2005, the contents of which are herein incorporated by reference in their entirety.

FIELD OF THE INVENTION

The present invention relates generally to semiconductor devices and, more particularly, to isolation layers for semiconductor devices and methods of fabricating same.

BACKGROUND OF THE INVENTION

As semiconductor devices have become highly integrated, the sizes of active regions and field regions on semiconductor substrates have been reduced. Various conductive structures can be formed in an active region and electrically separated from one another by a field region having an insulation layer. A field region is conventionally referred to as an isolation region and the insulation layer in the field region is conventionally referred to as an isolation layer. Conductive structures are frequently referred to as a conductive device, so the isolation region and the isolation layer are also referred to as a device isolation region and a device isolation layer, respectively. The reduction of size of an active region may cause a reduction of a gate length in a metal oxide semiconductor field effect transistor (MOSFET).

Particularly, the reduction of a gate length in a p-channel MOSFET (hereinafter referred to as p-MOSFET) may generate a parasitic transistor at a boundary portion between the active region and the device isolation region of a substrate due to a short channel length of the p-MOSFET. "Hot electrons induced punchthrough" (HEIP) may be discharged from the gate to thereby deteriorate the characteristics of the p-MOSFET.

Conventionally, a dummy pattern, such as a tab, may be formed on the boundary area between the active region and the device isolation region during the formation of a conventional gate of a p-MOSFET, so that the gate has a length sufficient to minimize HEIP.

However, the above conventional method of reducing HEIP may have various problems: Firstly, the dummy pattern may not contribute the elongation of the gate length when the gate is not aligned with the active region. Secondly, when neighboring gates are not spaced apart from each other by a sufficient distance, the dummy pattern may not be formed into a sufficient size. As a result, the dummy pattern may not contribute to the elongation of the gate length. For example, there may be a problem that neighboring dummy patterns are connected to each other when the gate has a length below about 90 nm. Thirdly, the channel length may be difficult to control at the boundary portion of the active region and the device isolation region due to a rounding effect.

SUMMARY OF THE INVENTION

Some embodiments of the present invention provide device isolation layers that can reduce or prevent HEIP at the boundary portion of an active region and a device isolation region.

Some embodiments of the present invention provide methods of forming device isolation layers that can reduce or prevent HEIP at the boundary portion of an active region and a device isolation region.

Some embodiments of the present invention provide p-MOSFETs wherein gate channels have a sufficient length at the boundary portion of an active region and device isolation layers.

Some embodiments of the present invention provide methods of manufacturing the above p-MOSFETs.

According to some embodiments of the present invention, there is provided an isolation layer for a semiconductor device. The isolation layer includes a trench oxide layer in a trench including a first sub-trench and a second sub-trench, a liner layer on the trench oxide layer and an insulation pattern. The trench oxide layer has first and second sub-oxide layers in the trench, and the first sub-oxide layer is continuously positioned on side and bottom surfaces of the first sub-trench having a first width and the second sub-oxide layer is continuously positioned on side and bottom surfaces of the second sub-trench having a second width greater than the first width. The first sub-oxide layer has a first thickness that is substantially uniform along the side and bottom surfaces of the first sub-trench and the second sub-oxide layer has a second thickness greater than the first thickness along the side surface of the second sub-trench. The liner layer is positioned on the trench oxide layer along the side and bottom surfaces of the first and second sub-trenches. The insulation pattern is filled into the first and second sub-trenches including the liner layer.

An increase of thickness in parts of the trench oxide layer due to the second thickness of the second sub-oxide layer may reduce or minimize the operation deterioration of the p-MOS transistor.

According to some embodiments of the present invention, the first and second sub-trenches are formed downwardly beneath the substrate, and the second sub-oxide layer partially overlaps with both end portions of a gate channel region of the substrate.

According to some embodiments of the present invention, the trench oxide layer has the first sub-oxide layer continuously formed on the side and bottom surfaces of the first sub-trench and the second sub-oxide layer continuously formed on the side and bottom surfaces of the second sub-trench. The second sub-oxide layer partially overlaps with both end portions of a gate channel region of the substrate, so that electrons are prevented from being trapped into the liner layer. As a result, reduced or no depletion layer is formed at the gate channel.

According to some embodiments of the present invention, there is provided an isolation layer for a semiconductor device. A trench is formed downwardly beneath substrate, and the trench includes a first sub-trench having a first width and a second sub-trench connected to the first sub-trench and having a second width larger than the first width. A trench oxide layer including the first and the second sub-oxide layers is formed on side and bottom surfaces of the trench. The first sub-oxide layer is formed on side and bottom surfaces of the first sub-trench and the second sub-oxide layer is formed on side and bottom surfaces of the second sub-trench. The first sub-oxide layer has a first thickness that is substantially uniform along the side and bottom surfaces of the first sub-trench and the second sub-oxide layer has a second thickness greater than the first thickness along the side surface of the second sub-trench. A liner layer is continuously formed on the trench oxide layer along the side and bottom surfaces of the trench, and an insulation pattern is formed in the trench including the liner layer. An increase of thickness in parts of the trench oxide layer due to the second thickness of the second sub-oxide layer may minimize the operational deterioration of the p-MOS transistor.

According to some embodiments of the present invention, the trench including the first sub-trench and the second sub-trench is formed by an etching process on the substrate using a hard mask as an etching mask.

According to some embodiments of the present invention, the trench oxide layer has the first sub-oxide layer continuously formed on the side and bottom surfaces of the first sub-trench and the second sub-oxide layer continuously formed on the side and bottom surfaces of the second sub-trench in such a manner that the second sub-oxide layer partially overlaps with both end portions of a gate channel region of the substrate. The first and second sub-trenches are formed by a thermal oxidation process.

According to some embodiments of the present invention, the second sub-oxide layer is about 1.2 to about 1.5 times as thick as the first sub-oxide layer, and a thickness of the second sub-oxide layer along the bottom surface of the second sub-trench is different from the second thickness of the second sub-oxide layer.

According to some embodiments of the present invention, there is provided a semiconductor device comprising a substrate divided into an active region on which conductive structures are formed, an isolation region, a device isolation layer including a trench oxide layer in the trench, a gate structure extending in a second direction perpendicular to the first direction on the substrate and source/drain regions formed at surface portions of the substrate adjacent to the gate structure. The isolation region includes a trench extending in a first direction and having a first sub-trench of a first width and a second sub-trench of a second width greater than the first width. The trench oxide layer includes a first sub-oxide layer formed on side and bottom surfaces of the first sub-trench and a second sub-oxide layer formed on side and bottom surfaces of a second sub-trench. The first sub-oxide layer has a first thickness that is substantially uniform along the side and bottom surfaces of the first sub-trench and the second sub-oxide layer has a second thickness greater than the first thickness along the side surface of the second sub-trench. The gate structure overlaps with the second sub-oxide layer of the trench oxide layer in the active region.

An increase of thickness in parts of the trench oxide layer due to the second thickness of the second sub-oxide layer may reduce or prevent the depletion layer from being formed at the gate channel (p-typed channel) of the p-MOS transistor to thereby reduce or prevent HEIP from occurring in the p-MOS transistor.

According to some embodiments of the present invention, a liner layer is further formed on the trench oxide layer along side and bottom surfaces of the trench, and an insulation pattern is filled to fill up the trench having the liner layer.

According to some embodiments of the present invention, the substrate includes an n-well into which n-type impurities are implanted, and the source/drain regions includes p-type impurities. The semiconductor includes a p-MOS transistor.

According to some embodiments of the present invention, there is provided a method of manufacturing a semiconductor device including a device isolation layer in which a thickness is locally increased. A substrate is provided to include an active region on which conductive structures are formed and an isolation region for defining the active region. The isolation region includes a trench extending in a first direction and has a first sub-trench of a first width and a second sub-trench of a second width greater than the first width. A device isolation layer including a trench oxide layer is formed in the trench. The trench oxide layer including a first sub-oxide layer formed on side and bottom surfaces of the first sub-trench and a second sub-oxide layer formed on side and bottom surfaces of a second sub-trench. The first sub-oxide layer has a first thickness that is substantially uniform along the side and bottom surfaces of the first sub-trench and the second sub-oxide layer has a second thickness greater than the first thickness along the side surface of the second sub-trench. A gate structure is formed on the substrate in a second direction perpendicular to the first direction such that the gate structure overlaps with the second sub-oxide layer of the trench oxide layer in the active region. Source/drain regions are formed at surface portions of the substrate adjacent to the gate structure by implanting impurities onto the substrate using the gate structure as an ion implantation mask.

According to some embodiments of the present invention, an increase of thickness in parts of a trench oxide layer due to the second thickness of a second sub-oxide layer may reduce or prevent the liner layer of a device isolation layer from trapping electrons from the active region of the substrate. In addition, reduced or no depletion layer is formed at the gate channel (p-typed channel) of the p-MOS transistor, so that the channel region reduction of the p-MOS transistor may be reduced or prevented. As a result, HEIP in the p-MOS transistor may be sufficiently reduced or prevented even though size of a gate structure in the p-MOS transistor may be decreased.

BRIEF DESCRIPTION OF THE DRAWINGS

The above and other features and advantages of the present invention will become more apparent by describing in example embodiments thereof with reference to the accompanying drawings, in which.

DESCRIPTION OF THE EXAMPLE EMBODIMENTS

Figure 1:
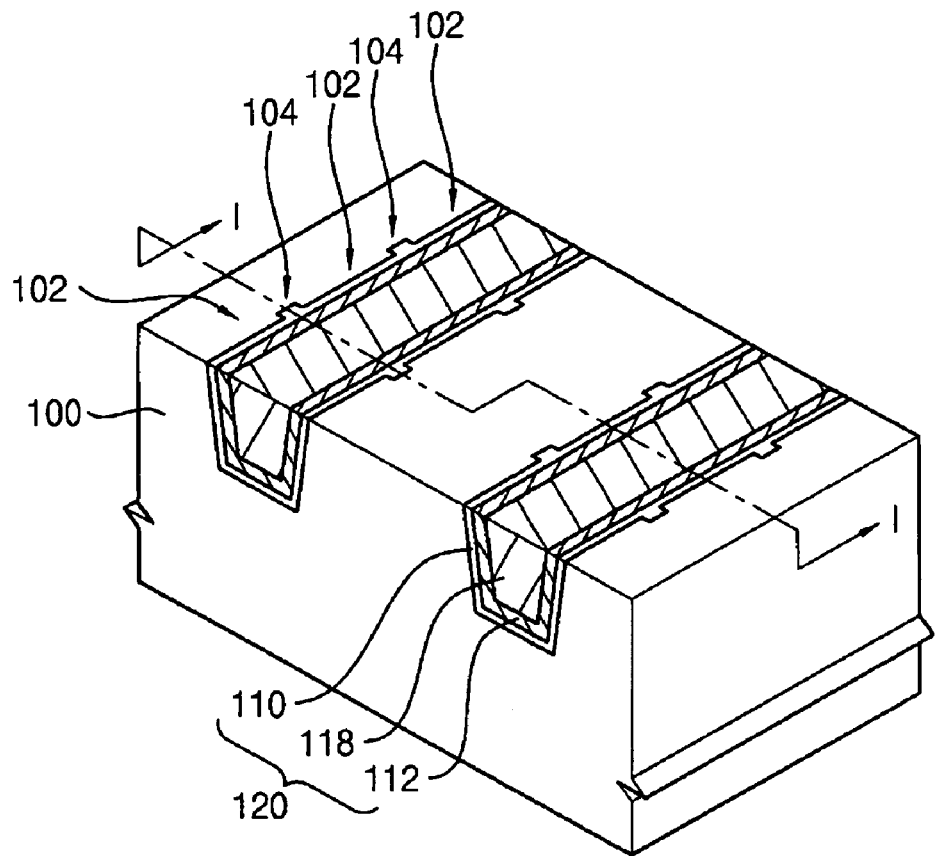
FIG. 1 is a perspective view illustrating a substrate on which a device isolation layer is formed in accordance with some embodiments of the present invention.

The invention is described more fully hereinafter with reference to the accompanying drawings, in which example embodiments of the invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Isolation Layer

Figure 2:
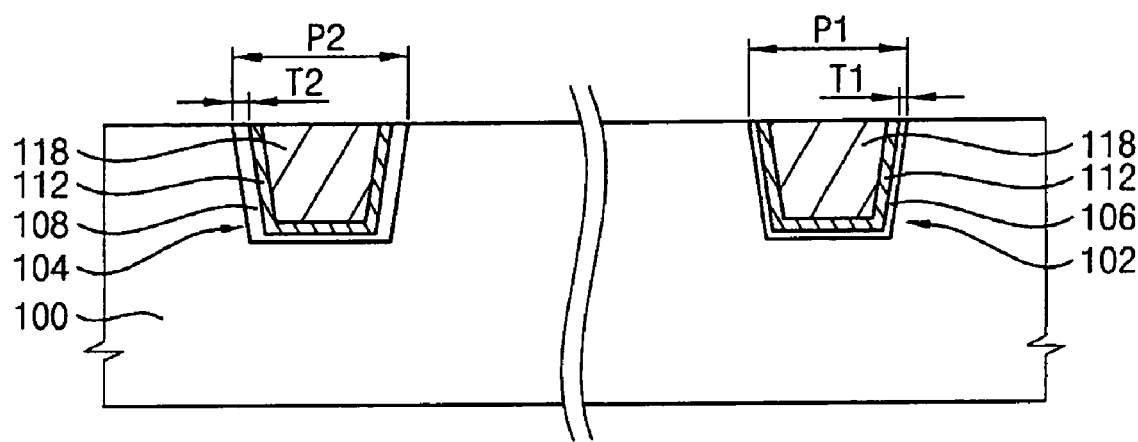
FIG. 2 is a cross-sectional view taken along a line I-I' in FIG. 1.

FIG. 1 is a perspective view illustrating a substrate on which a device isolation layer is formed in accordance with an example embodiment of the present invention, and FIG. 2 is a cross-sectional view taken along a line I-I' in FIG. 1.

Referring to FIG. 1, a trench is formed to a predetermined depth from a top surface of a semiconductor substrate 100 and an insulation layer is formed in the trench. The insulation layer in the trench isolates active regions of the substrate 100 from one another, so that conductive structures on the active region are also isolated from one another due to the insulation layer in the trench. Based on the reason described above, the insulation layer in the trench is referred to as an isolation layer or device isolation layer.

The trench includes a first sub-trench 102 having a first width P1 and a second sub-trench 104 having a second width P2. The first and second sub-trenches 102 and 104 are repeatedly and alternately formed on the substrate 100, thereby forming the trench on the substrate 100.

The substrate 100 includes a device isolation region in which the device isolation layer is formed, an active region in which a transistor is formed and a channel region on which a gate structure is formed.

The device isolation layer 120 includes a trench oxide layer 110 having a non-uniform thickness, a liner layer 112 and an insulation pattern 118.

The trench oxide layer 110 is formed on a side surface and a bottom surface of the first and second sub-trenches 102 and 104 of the substrate 100. A side surface of the trench oxide layer 110 is partially protruded correspondently to the second sub-trench 104, so that a thickness of the trench oxide layer 110 becomes locally greater correspondently to the second sub-trench 104. That is, the device isolation layer 120 is formed to a first thickness that is substantially uniform along the side and bottom surfaces of the first trench 102, and is formed to a second thickness that is added to the first thickness towards a side surface of the second sub-trench 104. Accordingly, the device isolation layer 120 has the first thickness at the bottom and side surfaces of the first sub-trench and the second thickness at the side surface of the second sub-trench.

Particularly, the trench oxide layer 110 includes a first sub-oxide layer 106 formed on the side and bottom surfaces of the first sub-trench 102 and a second sub-oxide layer 108 formed on the side and bottom surfaces of the second sub-trench 104.

The first sub-oxide layer 106 includes a first side surface (not shown) and a first bottom surface (not shown) that have the first thicknesses, and the second sub-oxide layer 108 includes a second side surface (not shown) that has the second thickness and a second bottom surface (not shown) that has the first thickness.

The second side surface of the second sub-oxide layer 108 reduces or prevents electrons from being captured in the liner layer 112, so that little or no depletion layer is formed at the channel region (not shown) of the substrate 100 corresponding to the boundary area of the active region and the device isolation region.

Particularly, the second side surface of the second sub-oxide layer 108 is formed to simultaneously overlap the active region and a gate area on which a gate electrode is formed so as to reduce or eliminate isolation of the depletion layer at the channel region.

According to some embodiments of the present invention, the second sub-oxide layer 108 is about 1.2 to about 1.5 times as thick as the first sub-oxide layer 106. That is, the second thickness of the second sub-oxide layer 108 is about 1.2 to about 1.5 times greater than the first thickness of the first sub-oxide layer 106. When the second thickness of the second sub-oxide layer 108 is below about 1.2 times of the first thickness of the first sub-oxide layer 106, electrons tend to be captured in the liner layer 112. The second thickness of the second sub-oxide layer 108 typically does not exceed about 1.5 times of the first thickness of the first sub-oxide layer 106.

According to some embodiments of the present invention, the first and second sub-oxide layers 106 and 108 may be simultaneously formed in the first and second sub-trenches 102 and 104, respectively, by a thermal oxidation process. The surface of the substrate 100 exposed through the first and second sub-trenches 102 and 104 are thermally oxidized using a process gas including oxygen during the thermal oxidation process. In other embodiments, the first and second sub-oxide layers 106 and 108 may be also simultaneously formed in the first and second sub-trenches 102 and 104, respectively, by a chemical vapor deposition (CVD) process using a silicon source gas and an oxidizing gas.

A side surface of the trench shown in FIG. 1 includes a recessed portion due to the thickness difference between the first and second sub-trenches 102 and 104, so that the thickness of the trench oxide layer 110 is formed to be greater at the second sub-trench 104 during the thermal oxidation process or the CVD process.

The liner layer 112 is formed on the trench oxide layer 110 to a substantially uniform thickness along the bottom and side surfaces of the first and second sub-trenches 102 and 104.

According to some embodiments of the present invention, the liner layer 112 comprises a nitride such as silicon nitride and silicon oxynitride. The liner layer 112 prevents the substrate 100 of the active region from being oxidized around the device isolation layer, and also prevents various impurities in the device isolation layer from being diffused into the substrate 100.

The insulation pattern 118 is formed on the liner layer 112 in the first and second sub-trenches 102 and 104. According to some embodiments of the present invention, the insulation pattern 118 includes an oxide layer. The oxide layer may include a boro-phosphor silicate glass (BPSG) layer, a phosphor silicate glass (PSG) layer, an undoped silicate glass (PSG) layer, a spin on glass (SOG) layer, an oxide layer formed through a middle temperature process and a tetraethylorthosilicate layer formed through a plasma enhanced CVD process. According to some embodiments of the present invention, the insulation pattern 118 includes a multilayer structure having a first sub-layer and a second sub-layer formed on the first sub-layer.

According to some embodiments of the present invention, the device isolation layer 120 includes the trench oxide layer 110 of which the thickness is partly large, and when the device isolation layer 120 is formed on the substrate 100 for a p-MOS transistor, electrons are sufficiently reduced or prevented from being trapped into the liner layer 112. As a result, the device isolation layer 120 can sufficiently reduce or prevent HEIP in the p-MOS transistor.

Method of Forming the Isolation Layer

FIGS. 3 to 6 are perspective views illustrating processing steps for a method of forming the device isolation layer shown in FIG. 1, and FIGS. 7 to 10 are cross-sectional views illustrating processing steps for a method of forming the device isolation layer shown in FIG. 2. In FIGS. 3 to 10, the same reference numerals denote the same elements in FIG. 1.

Figure 3:
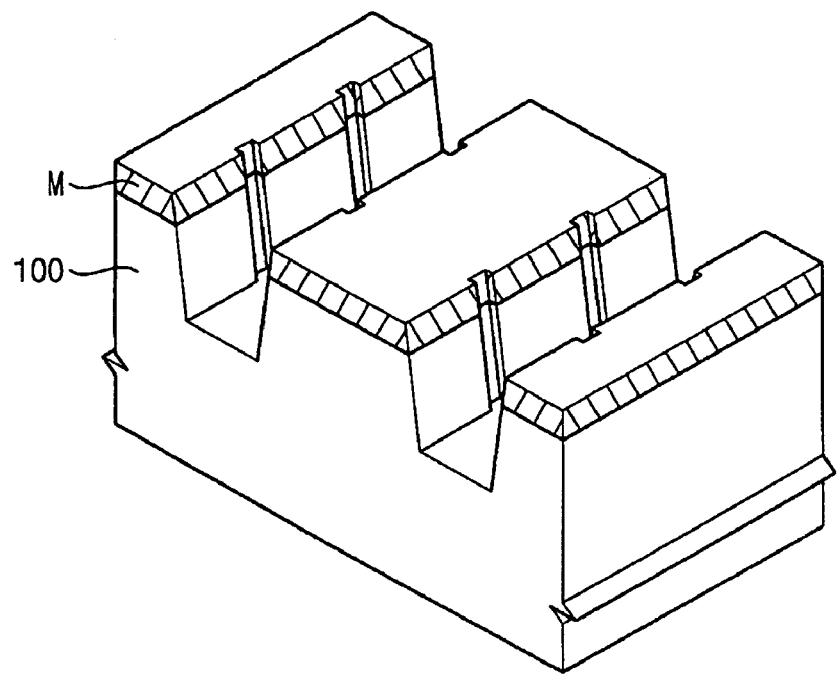
FIGS. 3 to 6 are perspective views illustrating a method of forming the device isolation layer shown in FIG. 1.
Figure 7:
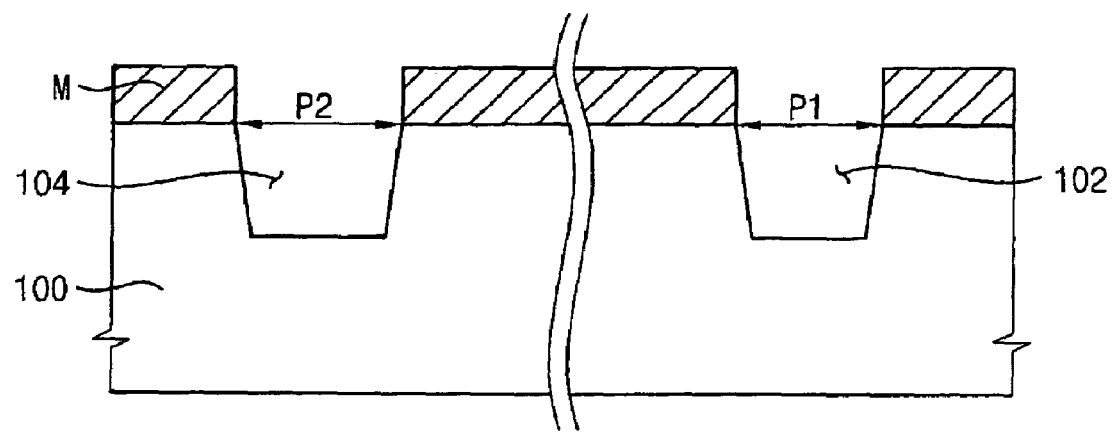
FIGS. 7 to 10 are cross-sectional views illustrating processing steps for a method of forming the device isolation layer shown in FIG. 2.

FIGS. 3 and 7 illustrate a processing step for a method of forming first and second sub-trenches on a substrate.

Referring to FIGS. 3 and 7, the substrate 100 is partially etched, for example, by a dry etching process using a hard mask pattern M as an etching mask, so that the first sub-trench 102 having a first width and the second sub-trench 104 having a second width are formed on the substrate 100 to thereby form the trench on the substrate 100. That is, the trench includes the first sub-trench 102 and the second sub-trench 104.

The hard mask pattern M is formed on the substrate 100 with, for example, silicon as the etching mask for forming the trench.

A nitride layer (not shown) is formed on the substrate 100 and a photoresist pattern (not shown) is formed on the nitride layer, so that the nitride layer is partially exposed through the photoresist pattern, as would be understood by one skilled in the art. Then, the nitride layer is partially removed from the substrate 100 by a dry etching process using the photoresist pattern as an etching mask, thereby forming the hard mask pattern M. An organic, anti-reflective coating layer may be further formed on the nitride layer before the photoresist pattern is formed on the nitride layer.

The nitride layer may comprise, for example, silicon nitride or silicon oxynitride. For example, when the nitride layer comprises silicon nitride, a low pressure CVD (LPCVD) process or a plasma enhanced CVD (PECVD) process may be utilized so as to form the nitride layer on the substrate 100. Silane ($SiH_4$) gas, dichlorosilane ($SiH_2Cl_2$) gas and ammonium ($NH_3$) gas may be used as a source gas and a carrier gas in the above LPCVD or PECVD process.

Thereafter, the photoresist pattern may be removed from the hard mask pattern M through an ashing process and a strip process, thereby forming the hard mask pattern through which the substrate 100 is partially exposed.

The substrate 100 is partially etched by a dry etching process using the hard mask pattern M as an etching mask, thereby forming the trench including the first sub-trench 102 and the second sub-trench 104 on the substrate 100. According to some embodiments of the present invention, the trench may be formed to a depth of about 1500 Å to about 3500 Å. According to some embodiments, the trench is formed to a depth of about 2500 Å. As a result, the substrate 100 is divided into the active region and the device isolation region extending in a first direction.

A pad oxide layer (not shown) may be further formed on the substrate 100 prior to the hard mask pattern M. According to some embodiments of the present invention, the pad oxide layer may be formed to a thickness of about 50 Å to about 300 Å, and more preferably, to a thickness of about 100 Å by a thermal oxidation process or a CVD process.

Figure 4:
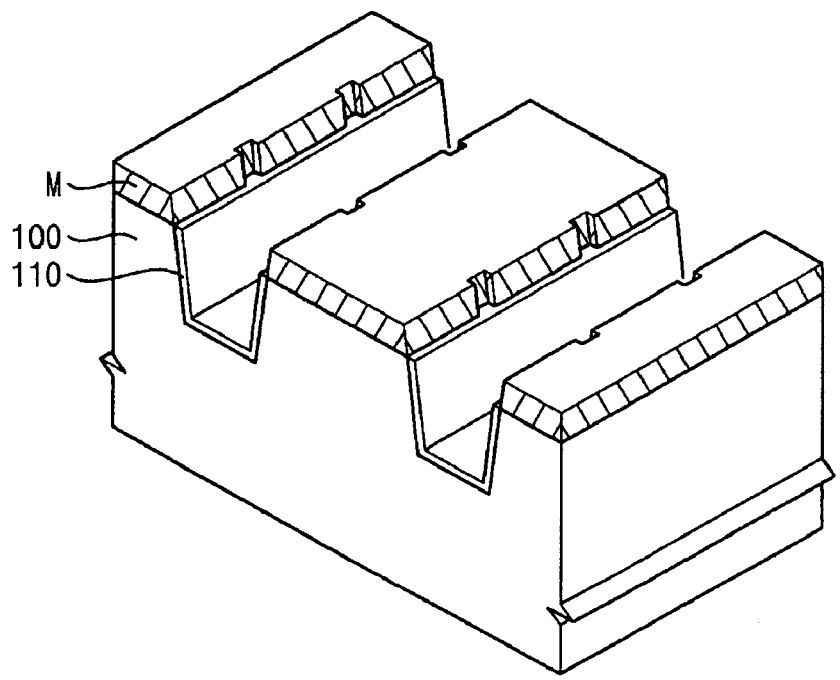
Figure 8:
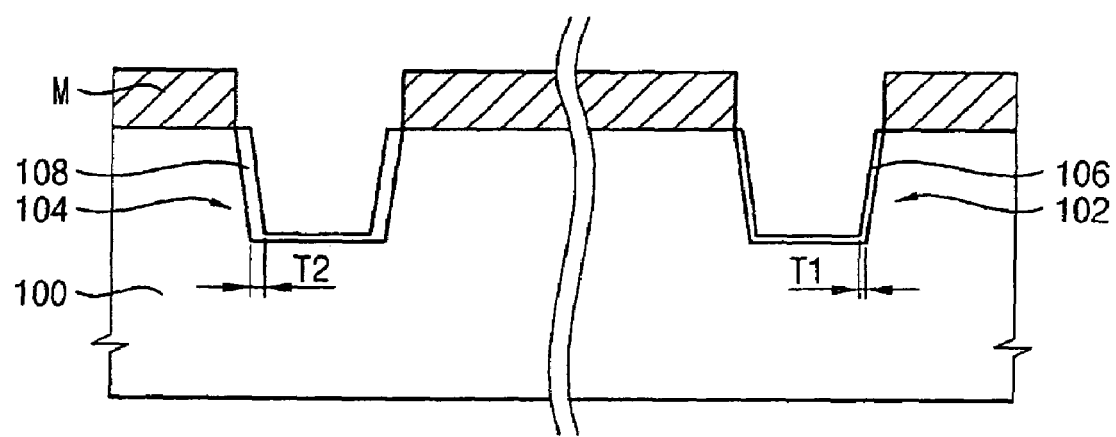

FIGS. 4 and 8 illustrate a processing step for a method of forming a trench oxide layer in first and second sub-trenches.

Referring to FIGS. 4 and 8, the trench oxide layer 110 is formed on the bottom and side surfaces of the first and second sub-trenches 102 and 104, so that the thickness of the trench oxide layer 110 becomes large relative to the second sub-trench 104.

Particularly, the trench oxide layer 110 includes a first sub-oxide layer 106 formed on the side and bottom surfaces of the first sub-trench 102 and a second sub-oxide layer 108 formed on the side and bottom surfaces of the second sub-trench 104.

The first sub-oxide layer 106 includes a first side surface (not shown) and a first bottom surface (not shown) that have the first thickness, and the second sub-oxide layer 108 includes a second side surface (not shown) that has the second thickness and a second bottom surface (not shown) that has the first thickness. The first and second sub-oxide layers 106 and 108 may be formed by a thermal oxidation process or a CVD process, for example.

The thermal oxidation process and the CVD process may be used for a simultaneous formation of the first and second sub-oxide layers 106 and 108. The thermal oxidation process may form the trench oxide layer 110 on the bottom and side surfaces of the trench without formation of the trench oxide layer on the hard mask pattern M.

The second sub-oxide layer 108 having the second thickness may partially overlap both end portions of the channel region (not shown) on which a gate structure is formed and may reduce or prevent electrons from being captured in the liner layer 112. As a result, little or no depletion layer is formed at the channel region of the substrate 100 corresponding to the boundary area of the active region and the device isolation region.

The partial overlap of the second sub-oxide layer 108 having the second thickness with the end portion of the channel region can reduce or prevent formation of the depletion layer at the channel region.

Figure 11:
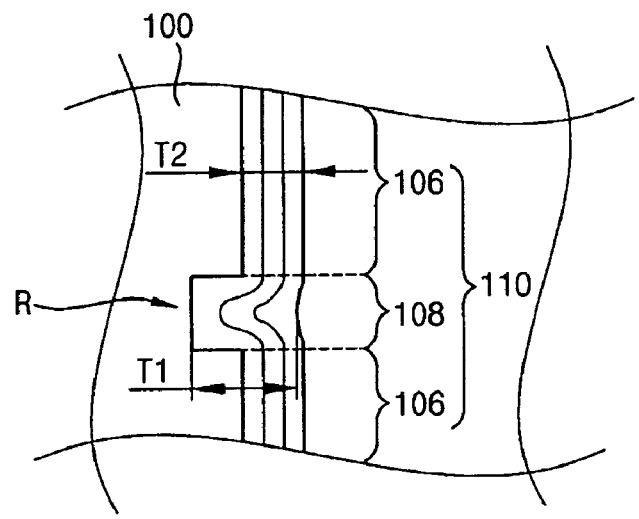
FIG. 11 is an enlarged view illustrating the second sub-oxide layer having the second thickness greater than the first thickness in the second sub-trench.

The second sub-oxide layer 108 in the second sub-trench 104 is illustrated in FIG. 11. FIG. 11 is an enlarged view illustrating the second sub-oxide layer 108 having a second thickness that is greater than the first thickness in the second sub-trench 104.

Referring to FIG. 11, the side surface of the trench includes a recessed portion R due to the width difference between the first and second sub-trenches 102 and 104. As a result, when the thermal oxidation process is performed on the substrate, an oxide layer is formed on three surfaces at the second sub-trenches 104 while the oxide layer is formed just only on one surface, so that the oxide layer is formed to a thickness in the second sub-trench 104 greater than in the first sub-trenches 102. Accordingly, the second sub-oxide layer 108 is formed to be thicker than the first sub-oxide layer 106 during the thermal oxidation process, and a thickness of the trench oxide layer is locally increased at the second sub-trench 104.

That is, the trench oxide layer 110 includes the second sub-oxide layer 108 having the second thickness at the second sub-trench 104 due to the recessed portion R. According to some embodiments of the present invention, the second thickness of the second sub-oxide layer 108 is about 1.2 to about 1.5 times as the first thickness of the first sub-oxide layer 106. The first and second thickness of the trench oxide layer 110 are sufficiently described above, so detailed descriptions about the first and second thickness of the trench oxide layer 110 will be omitted to avoid redundancy.

Figure 5:
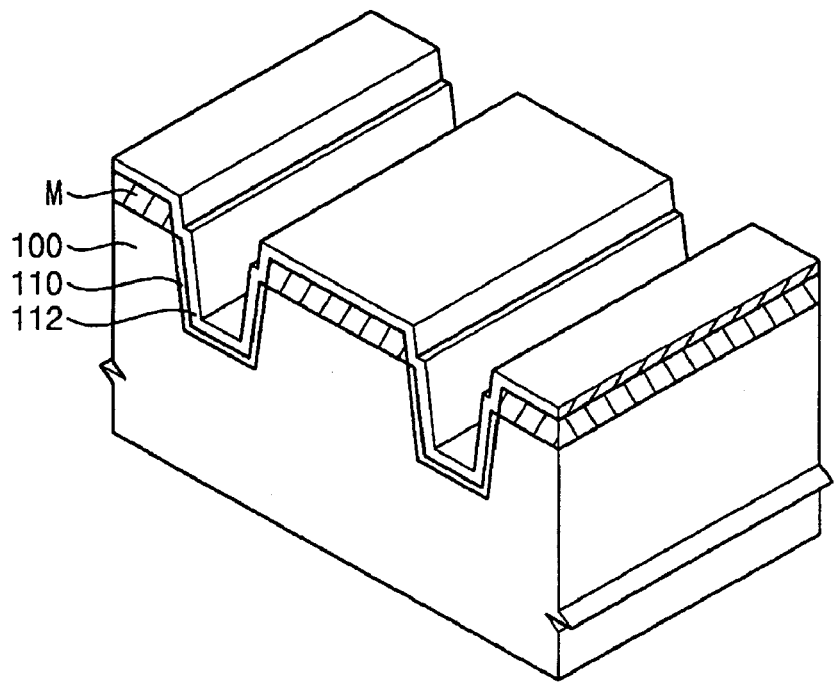
Figure 9:
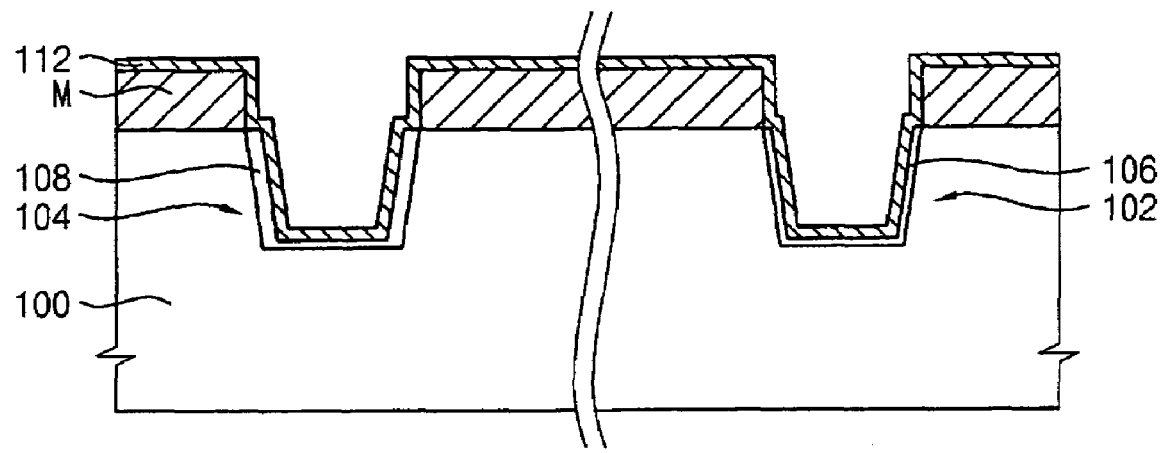

FIGS. 5 and 9 illustrate the processing step for a method of forming a liner layer on a trench oxide layer in the trench.

Referring to FIGS. 5 and 9, the liner layer 112 is formed on the trench oxide layer 110 to a substantially uniform thickness along the bottom and side surfaces of the first and second sub-trenches 102 and 104.

According to some embodiments of the present embodiment, silicon nitride or silicon oxynitirde may be deposited onto a surface of the trench oxide layer 110 to a uniform thickness along the bottom and side surfaces of the first and second sub-trenches 102 and 104, thereby forming the liner layer 112 on the trench oxide layer 110 to a substantially uniform thickness.

For example, when the liner layer 112 comprises silicon nitride, a low pressure CVD (LPCVD) process or a plasma enhanced CVD (PECVD) process may be utilized so as to form the liner layer 112 on the substrate 100. Silane (SiH4) gas, dichlorosilane (SiH2Cl2) gas and ammonium (NH3) gas may be used as a source gas and a carrier gas in the above LPCVD or PECVD process. The liner layer 112 reduces or prevents the substrate 100 of the active region from being oxidized around the device isolation layer, and also reduces or prevents various impurities in the device isolation layer from being diffused into the substrate 100. According to some embodiments of the present invention, the liner layer 112 may be omitted in accordance with the process conditions for forming of the device isolation layer, as would be known to one of the ordinary skill in the art.

However, the liner layer 112 includes a great number of electron trap sites, each of which is capable of capturing hot electrons, so that a plurality of hot electrons is captured into the liner layer 112. A plurality of other electrons having an electrical polarity opposite to that of the hot electrons is gathered around the liner layer 112 due to the hot electrons in the liner layer 112, and the gathered electrons around the liner layer 112 may deteriorate electrical characteristics of a semiconductor structure such as the p-MOS transistor adjacent to the device isolation layer. Hence, the liner layer 112 is formed on the trench oxide layer 110 after the trench oxide layer is formed in the trench in some embodiments.

Figure 6:
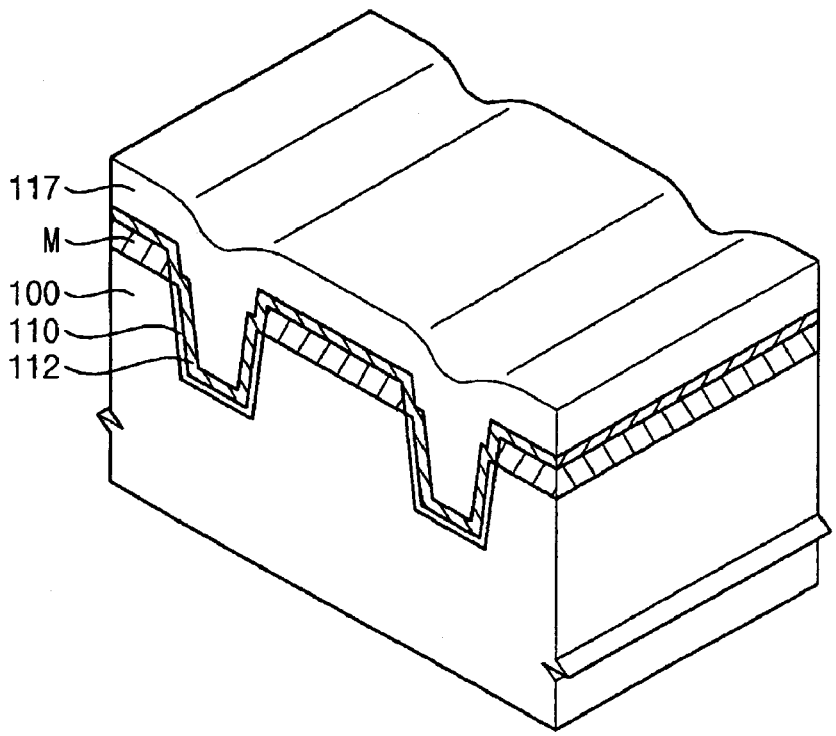
Figure 10:
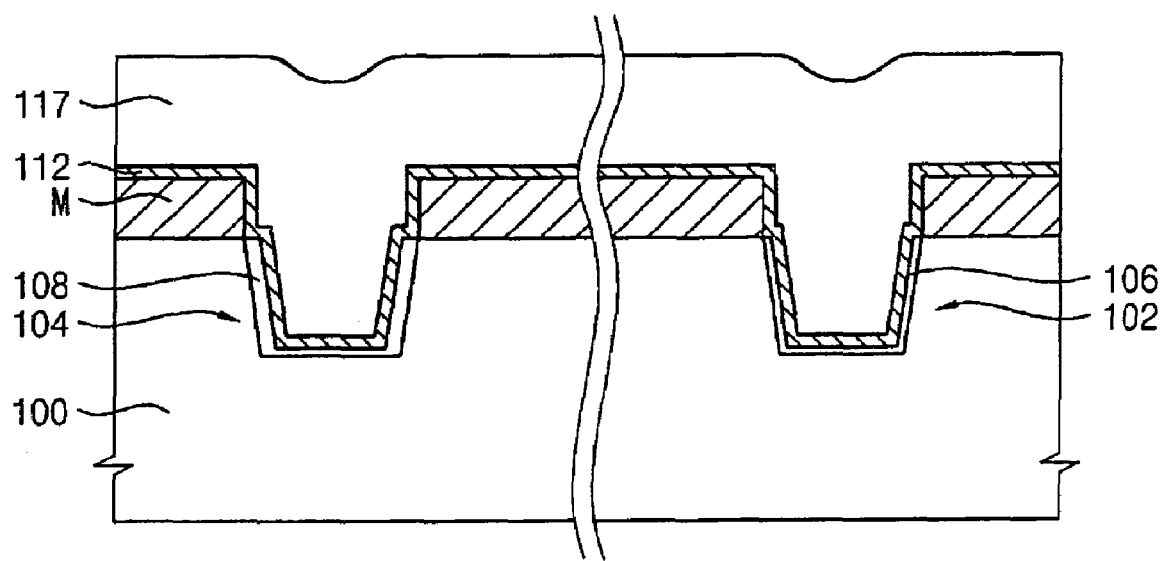

FIGS. 6 and 10 illustrate a processing step for a method of forming an insulation layer for a device isolation layer on a substrate.

Referring to FIGS. 6 and 10, an insulation layer 117 is formed on the substrate 100 to a sufficient thickness to fill up the first and second sub-trenches 102 and 104 including the liner layer 112. The insulation layer 117 may comprise, for example, BPSG, PSG, SOG, PE-TEOS, USG or HDP-CVD oxide, and may be formed on the substrate 100 through a CVD process, a spin coating process, a PECVD process or a HDPCVD process, for example.

According to some embodiments of the present invention, the insulation layer 117 may include a single layer structure having a single oxide layer, or may include a multilayer structure having at least two oxide layers.

The insulation layer 117 is partially removed from the substrate 100 by a planarization process, thereby forming the device isolation layer 118 on the substrate 100.

Particularly, the insulation layer 117 is partially removed from the substrate 100 by the planarization process until a top surface of the substrate 100 is exposed, so that the insulation layer 117 remains only in the trench to thereby form an insulation pattern 118 in the trench of the substrate 100. As a result, the trench oxide layer 110, the liner layer 112 and the insulation pattern 118 remain only in the trench of the substrate 100, thereby forming the device isolation layer 120 in the trench.

Although not shown, a thermal oxidation process may be performed on the substrate 100 at least once after the planarization process, thereby sufficiently increasing the thickness of the second sub-oxide layer 108 of the trench oxide layer 110. Top surfaces of the trench oxide layer 110, the liner layer 112 and the insulation pattern 118 are coplanar with the top surface of the substrate 100 and exposed to surroundings after the planarization process. The top surface of the trench oxide layer 110 may be further grown up during the thermal oxidation process, so that the thickness of the trench oxide layer may be further increased during the subsequent thermal oxidation process.

Accordingly, when the device isolation layer 120 including the trench oxide layer 110 is formed on the substrate 100 for forming the p-MOS transistor, the trench oxide layer 110 reduces or prevents the liner layer 112 from trapping the electrons from the active region of the substrate 100. As a result, the device isolation layer 120 of the present invention may sufficiently reduce or prevent HEIP in the p-MOS transistor.

Transistor for Semiconductor Devices

Figure 12:
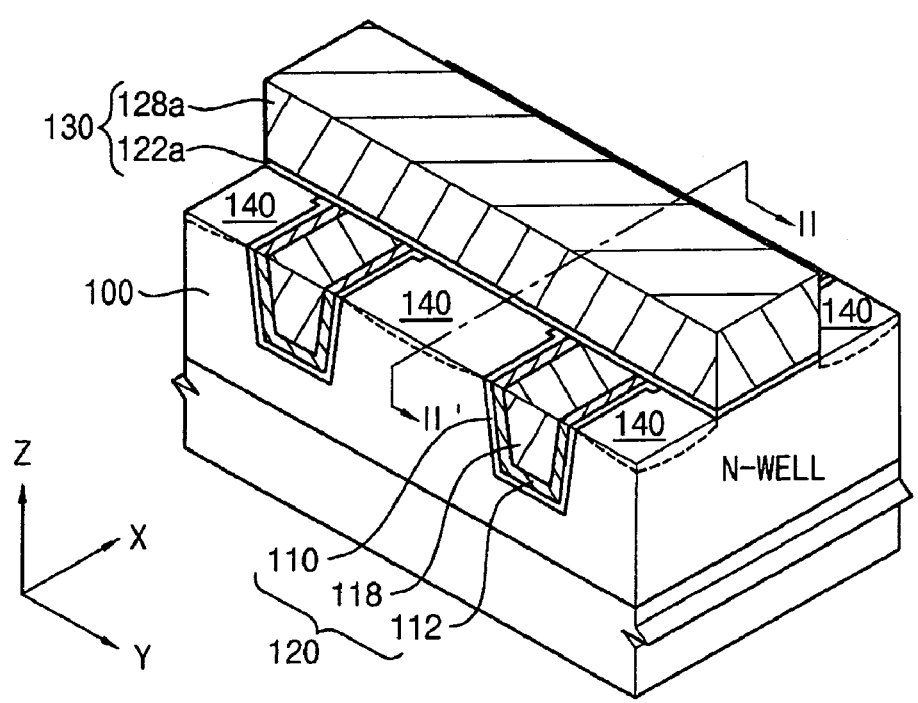
FIG. 12 is a perspective view illustrating a transistor including the device isolation layer shown in FIG. 1.
Figure 13:
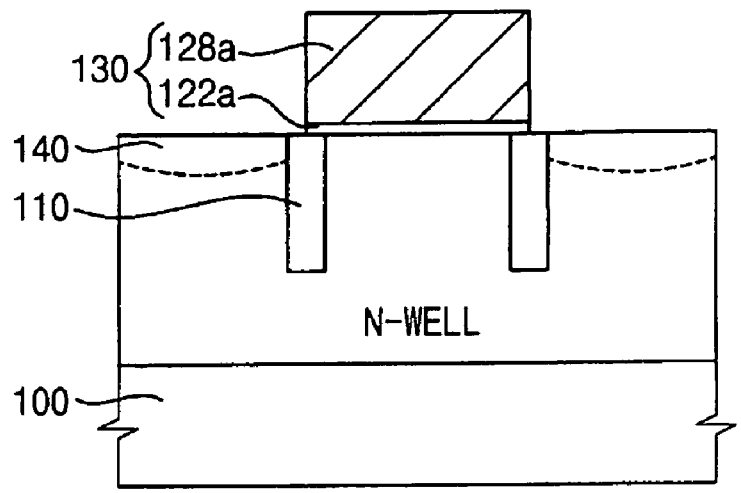
FIG. 13 is a cross-sectional view taken along the line II-II' in FIG. 12.

FIG. 12 is a perspective view illustrating a transistor including the device isolation layer shown in FIG. 1, and FIG. 13 is a cross-sectional view taken along the line II-II' in FIG. 12.

Referring to FIGS. 12 and 13, an active region is defined on a semiconductor substrate by a device isolation region. According to some embodiments of the present invention, N type impurities, including elements in Group V in a periodic table, are partially implanted onto the substrate 100, thereby forming an N-well for a p-MOS transistor.

A trench is formed in the device isolation region, so that the active region of the substrate is enclosed with the trench. According to some embodiments of the present invention, the trench includes a first sub-trench 102 having a first width and a second sub-trench 104 having a second width.

A device isolation layer 120 is formed on the device isolation region of the substrate. In the present embodiment, the device isolation layer 120 is formed in the first and second sub-trenches of the substrate. The device isolation layer 120 includes a trench oxide layer 110, a liner layer 120 and an insulation pattern 118. The trench oxide layer 110 has a first thickness and a local second thickness greater than the first thickness.

The trench oxide layer 110 includes a first sub-oxide layer 106 formed to the first thickness on side and bottom surfaces of the first sub-trench and a second sub-oxide layer 108 formed on side and bottom surfaces of the second sub-trench. The second sub-oxide layer 108 has the first thickness around the bottom surface of the second sub-trench and the second thickness, which is greater than the first thickness, around the side surface of the second sub-trench. The trench oxide layer 110, the liner layer 112 and the insulation pattern 118 are described above with reference to FIG. 1, so detailed descriptions about the trench oxide layer 110, the liner layer 112 and the insulation pattern 118 will be omitted to avoid redundancy.

A gate structure 130 including a gate insulation layer 122a and a gate electrode 128a is formed on the substrate 100. A gate channel region is formed at a surface portion below the gate structure 130 in the active region of the substrate 100.

In the present embodiment, the gate structure 130 overlaps with both the active region and the second sub-oxide layer 108 of the trench oxide layer 110, so that a depletion layer is not formed at the gate channel region.

The gate insulation layer 122a is formed on the substrate 100, and comprises, for example, silicon dioxide (SiO2) or a material having a dielectric constant larger than that of silicon dioxide (SiO2). Examples of the material having the dielectric constant larger than that of silicon dioxide (SiO2) include $HfO_2$, $ZrO_2$, $Ta_2O_5$, $Y_2O_3$, $Nb_2O_5$, $Al_2O_3$, $TiO_2$, $CeO_2$, $In_2O_3$, $RuO_2$, $MgO$, $SrO$, $B_2O_3$, $SnO_2$, $PbO$, $PbO_2$, $Pb_3O_4$, $V_2O_3$, $La_2O_3$, $Pr_2O_3$, $Sb_2O_3$, $Sb_2O_5$, $CaO$, etc. These can be used alone or in combinations thereof.

The gate electrode 128a is formed on the gate insulation layer 122a, and extends perpendicular to a longitudinal direction of the active region. In the illustrated embodiment, the gate electrode 128a is elongated and extends in a y-direction, as shown in FIG. 12. The gate electrode 128a may include polysilicon pattern doped with impurities or a multilayer structure having a doped polysilicon pattern and a metal silicide pattern. A gate spacer may be further formed on a sidewall of the gate electrode 128a.

Particularly, the gate electrode 128a overlaps with the second sub-oxide layer 108 of the trench oxide layer 110 in the active region.

Source/drain regions 140 are formed at surface portions of the active region adjacent to the gate electrode 128a. In the present embodiment, the source/drain regions 140 may be doped with impurities including boron (B). The source region is formed at a central portion of the active region and a bit line is electrically connected to the source region. The drain region is formed at both end portions of the active region and a capacitor is electrically connected to the drain region.

As a result, the gate structure 130 and the source/drain regions 140 doped with impurities including elements in Group III such as boron are formed on the substrate 100, thereby forming a p-MOS transistor on the substrate 100.

In the illustrated p-MOS transistor, little or no depletion layer is formed at the channel (especially, p-type channel) region of the active region, thereby reducing or minimizing a channel reduction of the p-MOS transistor. In addition, HEIP is sufficiently reduced or prevented in the p-MOS transistor even though the gate structure of the p-MOS transistor is downsized, which can improve operation characteristics of the p-MOS transistor especially when the gate length of the gate electrode is below about 100 nm.

Method of Manufacturing the Transistor

Figure 14:
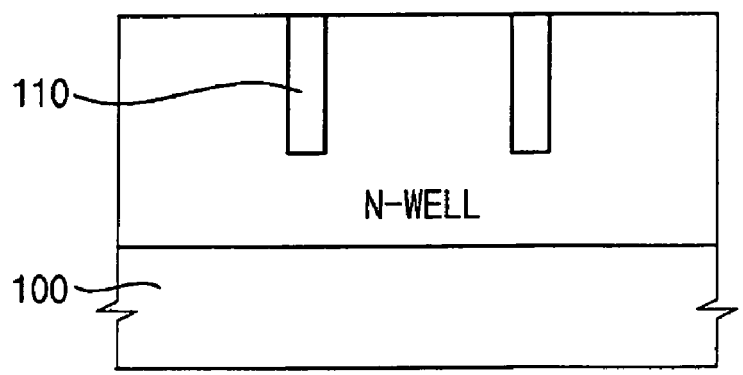
FIGS. 14 to 16 are cross-sectional views illustrating processing steps for a method of manufacturing the transistor shown in FIG. 13.
Figure 15:
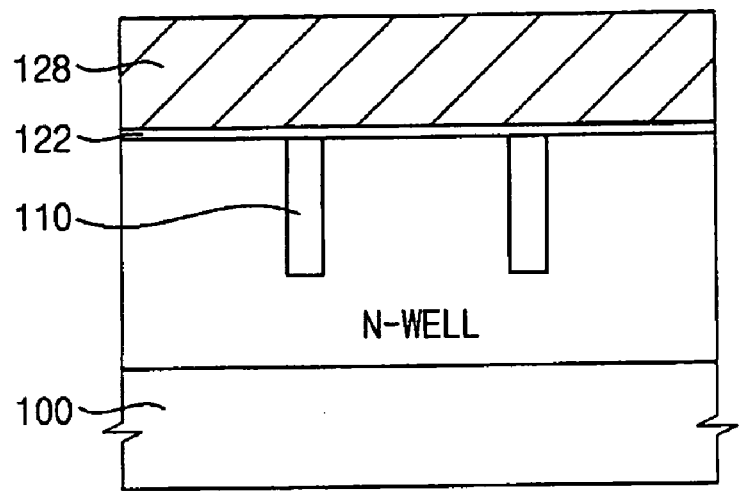
Figure 16:
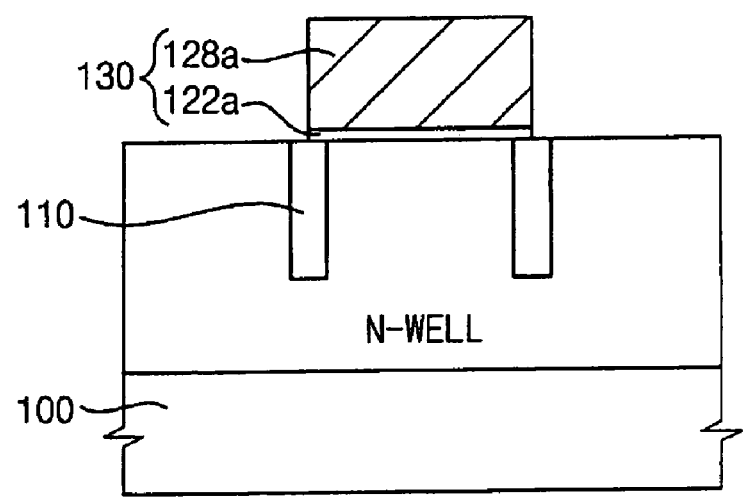

FIGS. 14 to 16 are cross-sectional views illustrating processing steps for a method of manufacturing the transistor shown in FIG. 13.

Referring to FIG. 14, processing steps are sequentially performed on the substrate 100, and the device isolation layer 120 is formed on the substrate 100. As described with reference to FIG. 12, the device isolation layer 120 includes the trench oxide layer 110, the liner layer 112 and the insulation pattern 118, and the trench oxide layer 110 includes a first thickness and a local second thickness greater than the first thickness.

The trench oxide layer 110 includes a first sub-oxide layer formed to a first thickness on the side and bottom surfaces of the first sub-trench and a second sub-oxide layer formed on the side and bottom surfaces of the second sub-trench, as described above. The second sub-oxide layer has the first thickness around the bottom surface of the second sub-trench and the second thickness, which is greater than the first thickness, around the side surface of the second sub-trench.

The liner layer 112 (FIG. 1) is continuously formed on the trench oxide layer 110 along the side and bottom surfaces of the first and second sub-trenches. The insulation pattern 118 (FIG. 1) is filled into the first and second sub-trenches including the liner layer 112. The trench oxide layer 110, the liner layer 112 and the insulation pattern 118 are described above with reference to FIG. 1, so detailed descriptions about the trench oxide layer 110, the liner layer 112 and the insulation pattern 118 will be omitted to avoid redundancy.

N-type impurities are lightly implanted onto the surface 100 on which the device isolation layer 120 is formed, and an n-well is formed at a surface portion of the substrate 100. The n-type impurities include any element in Group V in the periodic table.

Referring to FIG. 15, a gate isolation layer 122 is formed on the substrate 100 including the device isolation layer 120 by, for example, a thermal oxidation process, a CVD process and/or an atomic layer deposition (ALD) process.

The gate insulation layer 122 is formed on the substrate 100, and comprises silicon dioxide (SiO2) or a material having a dielectric constant larger than that of silicon dioxide (SiO2). Examples of the material having the dielectric constant larger than that of silicon dioxide (SiO2) include $HfO_2$, $ZrO_2$, $Ta_2O_5$, $Y_2O_3$, $Nb_2O_5$, $Al_2O_3$, $TiO_2$, $CeO_2$, $In_2O_3$, $RuO_2$, $MgO$, $SrO$, $B_2O_3$, $SnO_2$, $PbO$, $PbO_2$, $Pb_3O_4$, $V_2O_3$, $La_2O_3$, $Pr_2O_3$, $Sb_2O_3$, $Sb_2O_5$, $CaO$, etc. These can be used alone or in combinations thereof.

A conductive layer 128 and a gate mask (not shown) are formed on the gate insulation layer 122. In the present embodiment, the conductive layer 128 comprises polysilicon doped with impurities, and is to be patterned into a gate electrode 128*a*. According to some embodiments, the conductive layer 128 may include a polysilicide structure having a doped polysilicon layer and a metal silicide layer.

The gate mask has an etching selectivity with respect to a first insulation interlayer (not shown) that is to be formed in a subsequent process. For example, when the first insulation interlayer comprises an oxide such as silicon oxide, the gate mask comprises a nitride such as silicon nitride.

Referring to FIG. 16, the conductive layer 128 and the gate insulation layer 122 are sequentially removed from the substrate 100 by an etching process using the gate mask as an etching mask, so that a gate insulation pattern 122*a* and a gate electrode 128*a* are sequentially stacked on the substrate 100, thereby forming a gate structure 230 on the substrate 100. The gate structure 130 overlaps with both the active region and the second sub-oxide layer of the trench oxide layer 110, so that formation of a depletion layer may be sufficiently reduced or prevented at the gate channel region.

A silicon nitride layer may be further formed on the substrate 100 including the gate structure 130, and anisotropically etched off from the substrate 100, thereby forming a gate spacer (not shown) on a sidewall of the gate structure 230.

P-type impurities including elements in Group III are implanted onto a top surface of the substrate 100 using the gate structure 130 as an ion implantation mask, and then a heat treatment is conducted on the substrate 100. As a result, the source/drain regions 140 of a p-MOS transistor are formed at surface portions of the substrate 100, thereby completing the pMOS transistor including the gate structure 130 and the source/drain regions 140 on the substrate 100.

According to some embodiments of the present invention, the trench oxide layer of the device isolation layer for a p-MOS transistor is locally protruded into the active region, so that trapping electrons from the channel region of the active region in the liner layer of the device isolation layer may be reduced or prevented.

In addition, the device isolation layer for a p-MOS transistor sufficiently reduces or prevents a depletion layer from being formed at the gate channel (p-type channel) region of the active region, so that a size reduction of the channel region is reduced or prevented in the p-MOS transistor.

Furthermore, HEIP in the p-MOS transistor is sufficiently reduced or prevented although size of the gate structure of the p-MOS transistor is reduced.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific example embodiments of the present invention disclosed, and that modifications to the disclosed example embodiments, as well as other embodiments, are intended to be included within the scope of the appended claims. The present invention is defined by the following claims, with equivalents of the claims to be included therein.

What is claimed is:

1. A semiconductor device comprising:
   a substrate;
   a trench in a surface of the substrate, wherein the trench comprises first and second sub-trenches, wherein the first and second sub-trenches each comprise respective opposite side surfaces and a bottom surface, wherein the first sub-trench has a first width between respective side surfaces and wherein the second sub-trench has a second width between respective side surfaces that is greater than the first width;
   a trench oxide layer within the trench and having first and second sub-oxide layers, the first sub-oxide layer being positioned on side and bottom surfaces of the first sub-trench, and the second sub-oxide layer being positioned on side and bottom surfaces of the second sub-trench, and the first sub-oxide layer having a first thickness that is substantially uniform along the side and bottom surfaces of the first sub-trench, and the second sub-oxide layer having a second thickness that is substantially non-uniform along the bottom surface of the second sub-trench relative to the side surfaces of the second sub-trench and that is greater than the first thickness along the side surface of the second sub-trench;
   a liner layer on the trench oxide layer in the first and second sub-trenches; and
   an insulation pattern on the liner layer in the first and second sub-trenches.

2. The device of claim 1, wherein the substrate comprises a gate channel region, wherein the trench oxide layer comprises a first sub-oxide layer in the first sub-trench and a second sub-oxide layer in the second sub-trench, and wherein the second sub-oxide layer partially overlaps with end portions of the gate channel region.

3. The device of claim 2, wherein a thickness of the second sub-oxide layer along the bottom surface of the second sub-trench is different from a thickness of the second sub-oxide layer along respective side surfaces of the second sub-trench.

4. The device of claim 3, wherein the thickness of the second sub-oxide layer along respective side surfaces of the second sub-trench is about 1.25 to about 1.5 times as large as the thickness of the second sub-oxide layer along the bottom surface of the second sub-trench.

5. The device of claim 1, wherein a side surface of the trench including a recessed portion due to a difference between the first and second widths of the first and second sub-trenches.

6. The device of claim 1, wherein the insulation pattern includes a multilayer structure having a first sub-layer and a second sub-layer formed on the first sub-layer.

7. A method of forming an isolation layer for a semiconductor device, comprising:

forming a trench within a substrate, the trench including a first sub-trench having a first width and a second sub-trench connected to the first sub-trench and having a second width larger than the first width, wherein the first and second sub-trenches each comprise respective opposite side surfaces and a bottom surface;

forming a trench oxide layer having first and second sub-oxide layers within the trench, the first sub-oxide layer being formed on side and bottom surfaces of the first sub-trench, and the second sub-oxide layer being formed on side and bottom surfaces of the second sub-trench, and the first sub-oxide layer having a first thickness that is substantially uniform along the side and bottom surfaces of the first sub-trench, and the second sub-oxide layer having a second thickness that is substantially non-uniform along the bottom surface of the second sub-trench relative to the side surfaces of the second sub-trench and that is greater than the first thickness along the side surface of the second sub-trench;

forming a liner layer on the trench oxide layer in the first and second sub-trenches; and forming an insulation pattern on the liner layer.

8. The method of claim 7, wherein forming the trench within the substrate is performed by an etching process on the substrate using a hard mask as an etching mask.

9. The method of claim 7, wherein the second sub-trench overlaps with a portion of a channel region above which a gate electrode for a semiconductor device is formed.

10. The method of claim 7, wherein forming the first and second sub-oxide layers on the substrate is performed by a thermal oxidation process.

11. The method of claim 7, wherein the second sub-oxide layer is about 1.2 to about 1.5 times as thick as the first sub-oxide layer.

12. The method of claim 7, further comprising performing a thermal oxidation process on the substrate after forming the insulation pattern.

13. A semiconductor device comprising:
a substrate divided into an active region on which conductive structures are formed and an isolation region, the isolation region including a trench extending in a first direction and having a first sub-trench of a first width and a second sub-trench of a second width greater than the first width;
a device isolation layer including a trench oxide layer in the trench, the trench oxide layer including a first sub-oxide layer on side and bottom surfaces of the first sub-trench and a second sub-oxide layer on side and bottom surfaces of the second sub-trench, and the first sub-oxide layer having a first thickness that is substantially uniform along the side and bottom surfaces of the first sub-trench and the second sub-oxide layer having a second thickness that is substantially non-uniform along the bottom surface of the second sub-trench relative to the side surfaces of the second sub-trench and that is greater than the first thickness along the side surface of the second sub-trench;
a gate structure extending in a second direction perpendicular to the first direction on the substrate, the gate structure overlapping with the second sub-oxide layer of the trench oxide layer in the active region; and
source/drain regions at surface portions of the substrate adjacent to the gate structure.

14. The semiconductor device of claim 13, wherein the device isolation layer further includes:
a liner layer on the trench oxide layer along side and bottom surfaces of the trench; and
an insulation pattern filling up the trench including the liner layer.

15. The semiconductor device of claim 13, wherein the gate structure includes a gate oxide pattern and a gate electrode on the gate oxide pattern.

16. The semiconductor device of claim 13, wherein the substrate includes an n-well into which n-type impurities are implanted, and the source/drain regions includes p-type impurities.

17. The semiconductor device of claim 13, wherein the semiconductor includes a p-MOS transistor.

18. A method of manufacturing a semiconductor device, comprising:
providing a substrate divided into an active region on which conductive structures are formed and an isolation region;
forming a trench in the substrate extending in a first direction, and having a first sub-trench of a first width and a second sub-trench of a second width greater than the first width;
forming a device isolation layer including a trench oxide layer in the trench, the trench oxide layer including a first sub-oxide layer formed on side and bottom surfaces of the first sub-trench and a second sub-oxide layer formed on side and bottom surfaces of a second sub-trench, and the first sub-oxide layer having a first thickness that is substantially uniform along the side and bottom surfaces of the first sub-trench and the second sub-oxide layer having a second thickness greater than the first thickness, is substantially uniform along the side surface of the second sub-trench, wherein the second sub-oxide layer is substantially non-uniform along the bottom surface of the second sub-trench relative to the side surface of the second sub-trench;
forming a gate structure on the substrate in a second direction perpendicular to the first direction such that the gate structure overlaps with the second sub-oxide layer of the trench oxide layer in the active region; and
forming source/drain regions at surface portions of the substrate adjacent to the gate structure by implanting impurities onto the substrate using the gate structure as an ion implantation mask.

19. The method of claim 18, wherein forming the device isolation layer in the trench further includes:
forming a liner layer on the trench oxide layer along side and bottom surfaces of the trench; and
forming an insulation pattern filling up the trench including the liner layer.

20. The method of claim 18, wherein forming the gate structure includes:
forming a gate oxide layer on the substrate;
forming a conductive layer on the gate oxide layer; and
sequentially etching the conductive layer and the gate oxide layer using a hard mask pattern as an etching mask.

21. The method of claim 18, wherein the impurities in the source/drain regions include an element in Group III in a periodic table.

* * * * *